(12) United States Patent
Torigoe et al.

(10) Patent No.: US 6,985,659 B2
(45) Date of Patent: Jan. 10, 2006

(54) OPTICAL TRANSMISSION MODULE

(75) Inventors: Makoto Torigoe, Yokohama (JP); Kazumi Kawamoto, Yokohama (JP); Takashi Suga, Yokohama (JP); Hiroyasu Sasaki, Yokohama (JP); Fumitoshi Goto, Yokohama (JP)

(73) Assignee: OpNext Japan, Inc., Yokohama (JP)

( * ) Notice: Subject to any disclaimer, the term of this patent is extended or adjusted under 35 U.S.C. 154(b) by 0 days.

(21) Appl. No.: 10/631,411

(22) Filed: Jul. 30, 2003

(65) Prior Publication Data

US 2004/0264882 A1    Dec. 30, 2004

(30) Foreign Application Priority Data

Jun. 30, 2003    (JP)    ............................ 2003-187514

(51) Int. Cl.
    *G02B 6/44*    (2006.01)
(52) U.S. Cl. .......................... 385/114; 385/9; 385/40; 385/89
(58) Field of Classification Search .................. 385/14
    See application file for complete search history.

(56) References Cited

U.S. PATENT DOCUMENTS

| | | | | |
|---|---|---|---|---|
| 31,477 A | * | 2/1861 | Ruggles | .................. 188/74 |
| 4,748,293 A | * | 5/1988 | Kikuchi et al. | .............. 174/268 |
| 5,742,484 A | * | 4/1998 | Gillette et al. | .............. 361/789 |
| 6,281,451 B1 | * | 8/2001 | Chan et al. | .................. 174/262 |
| 6,343,171 B1 | * | 1/2002 | Yoshimura et al. | ........... 385/50 |
| 6,612,863 B2 | * | 9/2003 | Terai | ........................... 439/492 |
| 6,797,891 B1 | * | 9/2004 | Blair et al. | .................. 174/268 |

FOREIGN PATENT DOCUMENTS

| | | |
|---|---|---|
| JP | 09-148675 | 6/1997 |
| JP | 2002-335034 | 11/2002 |

* cited by examiner

*Primary Examiner*—Frank G. Font
*Assistant Examiner*—Erin D. Chiem
(74) *Attorney, Agent, or Firm*—Townsend and Townsend and Crew LLP

(57) ABSTRACT

The present invention relates to an optical transmission module comprising two substrates, each of which has an electronic part mounted on the substrate and a terminal area for inputting/outputting an electric signal into/from the electronic part, wherein an electrical connection is made between the terminal areas of said two substrates by use of a flexible substrate having a structure constituted of at least three layers, and thereby a high frequency signal is transmitted between the electronic part mounted on one substrate and the electronic part mounted on the other substrate through the flexible substrate while confining an electromagnetic field.

In addition, the present invention provides an optical transmission module characterized in that a slit formed in a ground plane on a connection section of a three-layer flexible substrate reduces a disturbance in electromagnetic field, making it possible to improve the transmission characteristic of a high frequency signal.

14 Claims, 11 Drawing Sheets

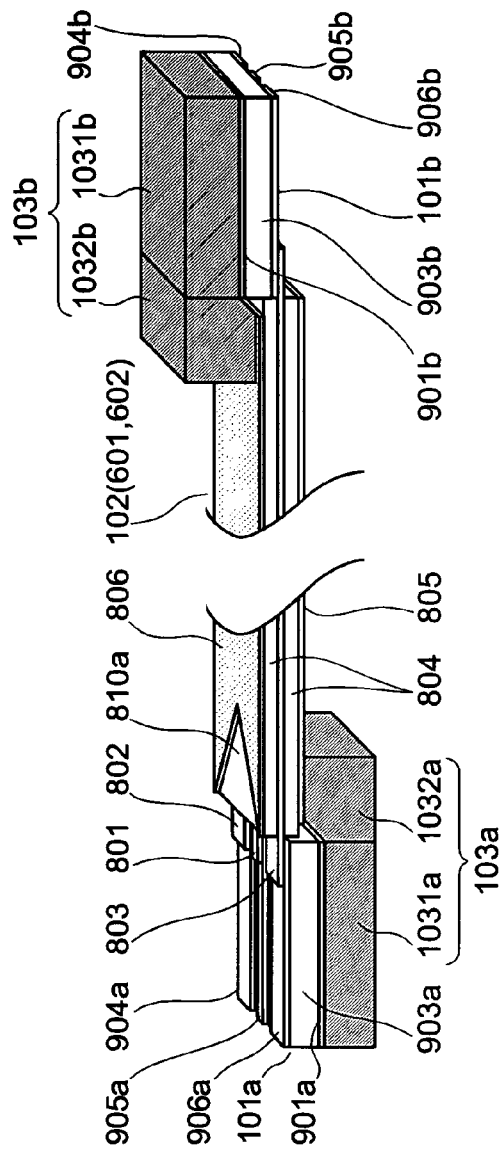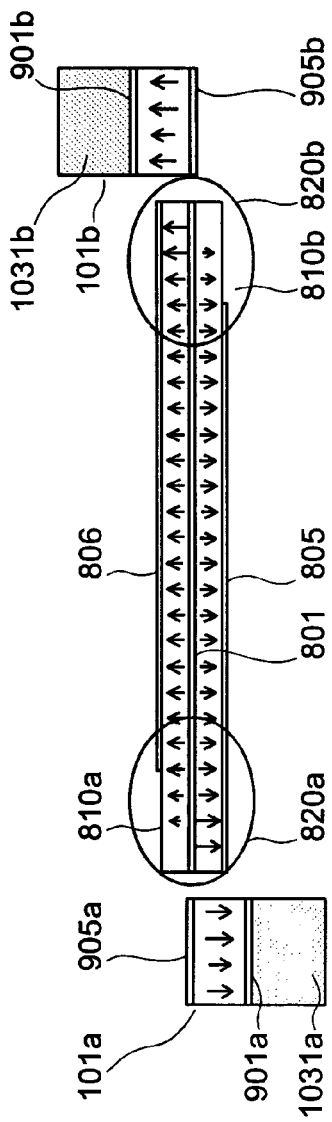

→ Electric line of force

→ Electric line of force

→ Electric line of force

FIG.12
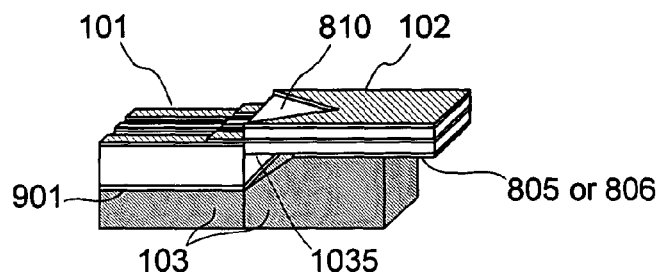
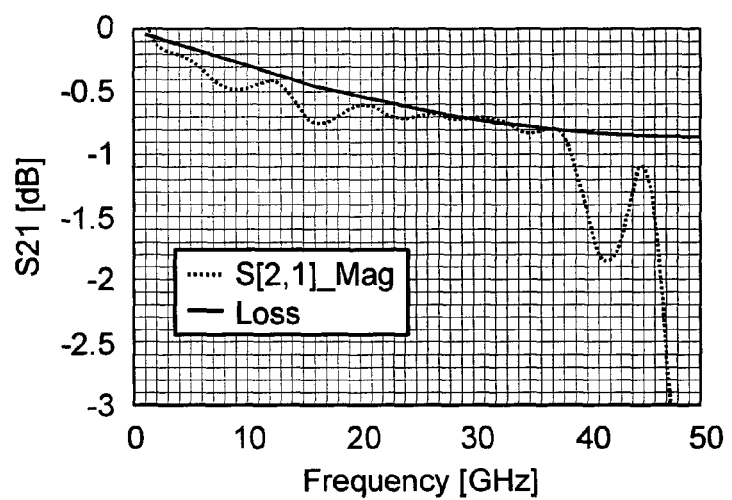

FIG.13A
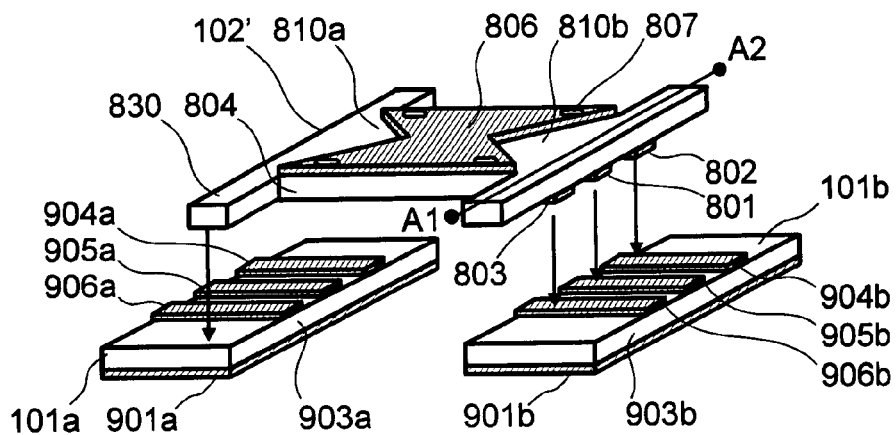
FIG.13B
FIG.13C
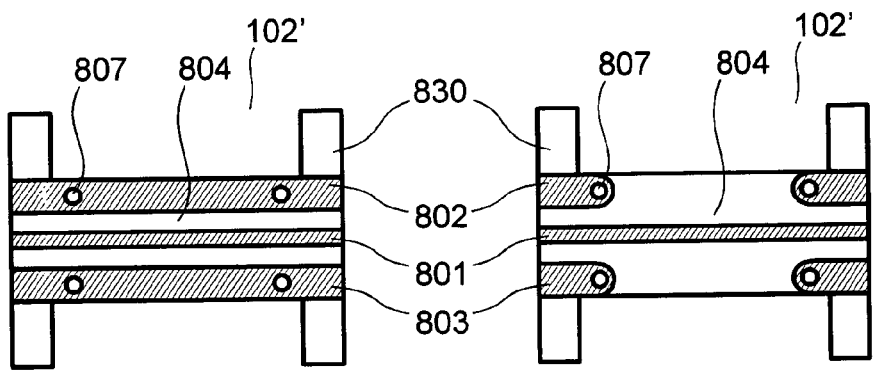
FIG.13D
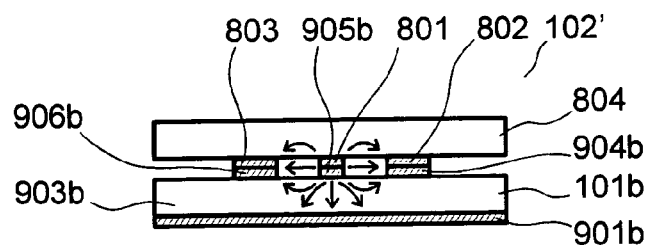

OPTICAL TRANSMISSION MODULE

BACKGROUND OF THE INVENTION

The present invention relates to an optical transmission module in which electronic parts are connected through a flexible substrate.

The conventional optical module which uses a coplanar waveguide is known in Japanese Patent Laid-Open No. 9-148675 and Japanese Patent Laid-Open No. 2002-335034. The patent document 1 describes a mounting structure of an optical module in which a connection is made at least between a terminal block of a package and a substrate for a luminous element by use of a flexible substrate on which a stripe-shaped signal conductor and ground conductors parallel with, and on both sides of, the signal conductor are place so as to form an insulated layer, and for which impedance matching is performed. In addition, the patent document 2 describes an optical module in which an electrical connection is made between a semiconductor laser and an electric signal input/output section of a package by use of a feedline comprising a dielectric substrate made of a material, the thermal conductivity of which is lower than that of aluminum oxide, and a conductor film formed on the dielectric substrate.

SUMMARY OF THE INVENTION

By the way, for the purpose of achieving the miniaturization, and greater densities, of devices, optoelectronic transducers or electrooptical transducers, provided with the coplanar waveguide described in the prior art as a high-frequency output terminal, are being developed. If such a module is used, there are the following conceivable methods: placing a substrate in proximity to the module, and connecting between the substrate and the module using a bonding wire; and connecting between the substrate and the module using a flexible substrate. This can reduce a thickness required for connection sections to a large extent, making it possible to slim down the whole device.

However, if the bonding wire is used, the accuracy in positioning of the module and the substrate becomes important, which creates the inconvenience of handling. If the flexible substrate is used, the flexibility of placement is improved independent of where the substrate and the module are placed.

FIG. 1 illustrates an example of the flexible substrate. FIG. 15A is an example of a flexible substrate having a one-layer metallic layer. The flexible substrate forms a transmission line having a coplanar structure in which there are a signal conductor 701, and ground conductors 702, 703 placed on its both sides, on a dielectric 704. The coplanar waveguide generates an electromagnetic field between the signal conductor and the ground conductors, and transmits signal energy. FIG. 15B is a schematic diagram illustrating electric lines of force. Around the coplanar line, an electromagnetic field is distributed also over space outside the substrate, and accordingly, the coplanar line is subject to outside effects. Because the strength of the electromagnetic field decreases with increase in distance from the coplanar line, a conductor which is sufficiently far does not influence the transmission characteristic. However, if there is another conductor or dielectric, an electromagnetic field of which is high, in close proximity, the conductor or the dielectric causes impedance to change, which deteriorates the transmission characteristic.

Additionally, another problem is that an electromagnetic field leaking out is repeatedly reflected by inner walls of a device, causing the cavity resonance that resonates at a specific frequency, which deteriorates the transmission characteristic.

An object of the present invention is to provide a flexible substrate that connects between substrates, each of which has an electronic part mounted on the substrate, wherein the high-frequency transmission characteristic is improved for the purpose of solving the above-mentioned problems, and to provide a small-sized and low-priced optical transmission module having a structure in which a connection is made between the substrates by use of the flexible substrate.

Further, another object of the present invention is to provide an optical transmission module in which a disturbance in electromagnetic field is reduced in each connection section between the flexible substrate and the substrate, and consequently the high-frequency transmission characteristic is improved, and what is more, the small size and the low price are achieved.

According to one aspect of the present invention, there is provided an optical transmission module, wherein: an electrical connection is made between terminal areas of two substrates by use of a flexible substrate having a structure constituted of at least three layers, said flexible substrate comprising: a signal conductor; ground conductors that are placed on both sides of the signal conductor while keeping a distance from the signal conductor; ground planes provided on both an upper layer and a lower layer of the signal conductor across a dielectric; and a conductor that electrically connects between the ground conductor and the ground plane.

In particular, the present invention is characterized by an optical transmission module in which an electrical connection is made between a first substrate comprising a terminal area having a signal conductor on the front side and a second substrate having a signal conductor on the back side by use of a flexible substrate having a structure constituted of at least three layers.

Moreover, the present invention is characterized by a structure whereby in the connection section of the flexible substrate, which is connected to the terminal area of the substrate, providing, for example, a slit in a ground plane causes the electric field density observed in an area from a signal conductor of a middle layer to the ground plane to gradually decrease from inside toward an edge of the flexible substrate in a longitudinal direction, or a structure in which a distance between the signal conductor of the middle layer and an edge of the ground plane in a width direction is changed from inside toward the edge of the flexible substrate in a longitudinal direction. The characteristics can also be applied to a flexible substrate having a structure constituted of two or more layers. In this case, a terminal area of a substrate to be connected is formed of a one-layer coplanar waveguide.

It is to be noted that the terminal area of the substrate to be connected is often formed of a grounded coplanar waveguide.

Additionally, only a connection of the second substrate to the flexible substrate having a structure constituted of at least three layers characterizes the present invention.

As described above, according to the present invention, transmitting a high frequency signal while confining an electromagnetic field within the flexible substrate produces effects of reducing the radiation of the electromagnetic field, and improving the transmission characteristic.

In addition, according to the present invention, as produced effects, a disturbance in electromagnetic field occurring in the connection between the flexible substrate and the terminal area of the substrate can be reduced, and thereby an excellent transmission characteristic can be achieved.

Moreover, according to the present invention, a transmission characteristic of a high frequency signal can be improved, and what is more, a small and low-cost optical transmission module can be realized, which are also produced effects.

BRIEF DESCRIPTION OF THE DRAWINGS

FIGS. 2A and 2B are diagrams illustrating a method for connecting between terminal areas of two substrates by use of a flexible substrate having a three-layer structure according to the present invention, more specifically, FIG. 2A is its perspective view, and FIG. 2B is a longitudinal sectional view illustrating a change in electromagnetic field in the longitudinal direction;

FIG. 4A is its perspective view, and FIG. 4B is a cross-sectional view illustrating electromagnetic field distribution;

FIG. 5A is its perspective view, and FIG. 5B is a cross-sectional view illustrating electromagnetic field distribution;

FIG. 9A is a perspective view looking from the upper left side, and FIG. 9B is a perspective view looking from the upper right side;

FIG. 12 is a diagram illustrating the relationship between a frequency [GHz] and a transmission characteristic (S21 [dB]) obtained when a flexible substrate, according to the present invention, having a three-layer structure in which a slit having a length of 1 mm is formed is connected to a terminal area of a substrate and then an inclined plane is formed on a boundary part of a step on a metal block which connects between both ground planes;

FIGS. 13A through 13D are diagrams illustrating another embodiment in which a flexible substrate is used to make a connection between two substrates according to the present invention, more specifically, FIG. 13A is a perspective view of the embodiment, FIG. 13B is a bottom plan view illustrating a flexible substrate formed of a grounded coplanar waveguide, FIG. 13C is a bottom plan view illustrating a flexible substrate formed of a microstrip transmission line, and FIG. 13D is a cross section, along a line A1–A2 in FIG. 13A, illustrating electromagnetic field distribution;

FIG. 14A is a perspective view of the modified embodiment, FIG. 14B is a bottom plan view illustrating a flexible substrate formed of a microstrip transmission line, and FIG. 14C is a cross section, along a line B1–B2 in FIG. 14A, illustrating electromagnetic field distribution; FIG. 15A is its perspective view, and FIG. 15B is a cross-sectional-view illustrating electromagnetic field distribution.

DETAILED DESCRIPTION OF THE PREFERRED EMBODIMENT

Embodiments of an optical transmission module for transmitting an electric signal at high speed between two substrates, each of which has an electronic part mounted on the substrate, by use of a flexible substrate according to the present invention will be described with reference to drawings.

In recent years, in the field of electronic equipment for handling a high frequency signal of about 40 Gbit/s such as an optical transceiver, miniaturization, and speedup, of a device is progressing.

Figure 1:
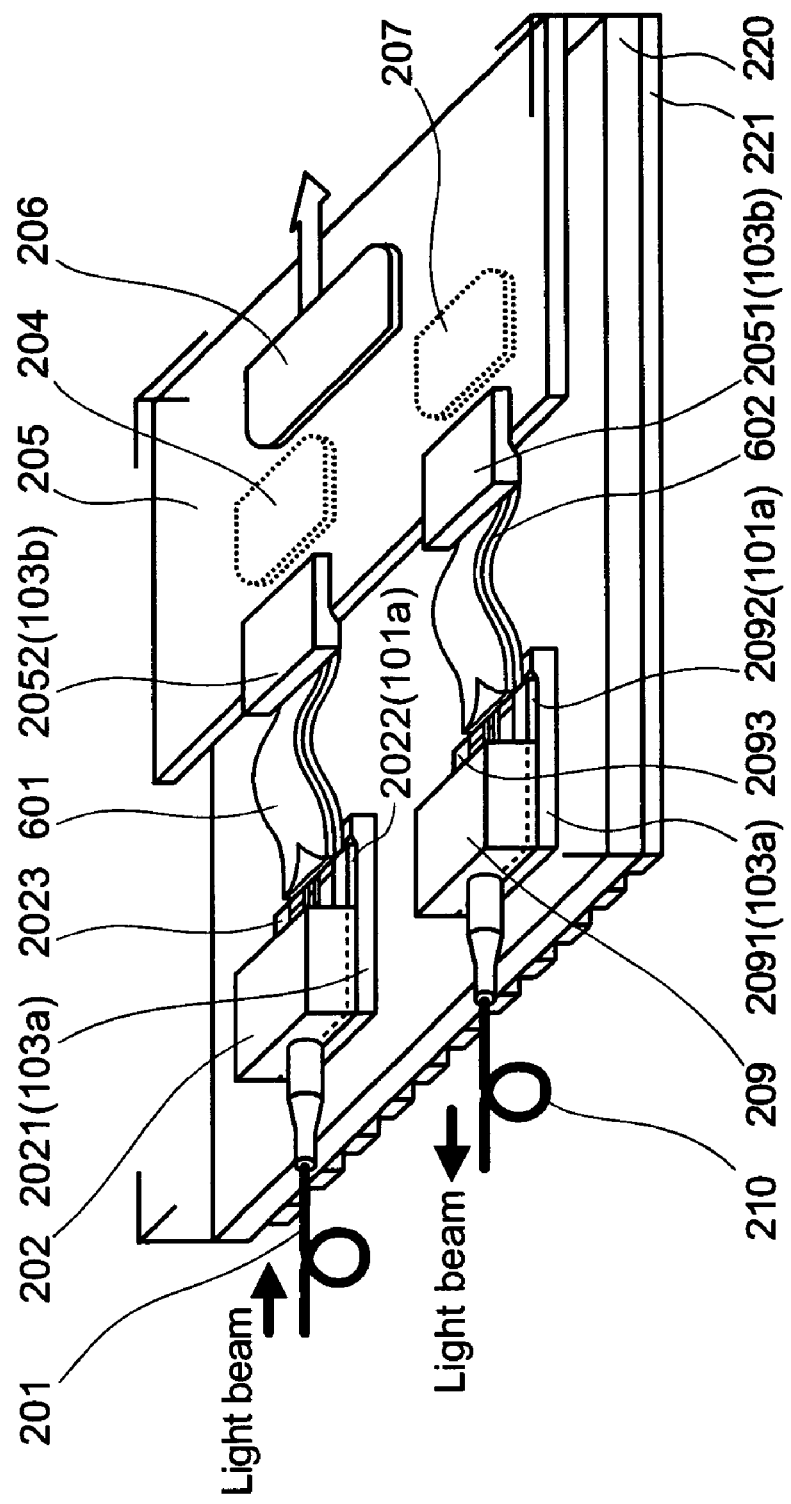
FIG. 1 is a perspective view illustrating one embodiment of an optical transceiver according to the present invention.

FIG. 1 is a diagram illustrating an optical transceiver as one embodiment of an optical transmission module according to the present invention. In the optical transceiver, a light signal inputted from an optical fiber 201 is converted into an electric signal by an optoelectronic transducer 202 (having an amplifier (not illustrated) at an output stage), and then the electric signal is amplified. A high-speed electric signal of about 40 Gbit/s output from the optoelectronic transducer 202 is transmitted to a demultiplexer 204 (composite circuit) mounted on the back side through a flexible substrate 601 according to the present invention relating to transmission and further through signal electric wiring formed on the back side of a printed-circuit board 205. After that, the demultiplexer (composite circuit) 204 converts the transmitted electric signal into, for example, lower-speed 4 to 16 parallel signals, the speed of which is about 10 Gbit/s to 2.5 Gbit/s. Moreover, the low-speed signals are output from a connector 206, which is mounted on the front side, through the signal electric wiring formed on the back side of the printed-circuit board (substrate) 205 before the signals are transmitted to other modules.

When a high-speed electric signal is parallel converted into a signal as low as 2.5 Gbit/s, on the other hand, the lower-speed parallel signals of about 2.5 Gbit/s inputted from the connector 206 are transmitted to a multiplexer (multiplexing circuit) 207, which is mounted on the back side, through the signal electric wiring formed on the back side of the printed-circuit board 205, and are then converted into a high-speed signal of about 40 Gbit/s by the multiplexer (multiplexing circuit) 207. This high-speed signal is transmitted from the signal electric wiring on the back side of the printed-circuit board 205 to an electrooptical transducer 209 (having an IC driver (drive circuit) at an input stage) through a flexible substrate 208 according to the present invention. After that, the high-speed signal is converted into a light signal by the electrooptical transducer 209 before the light signal is transmitted to outside through an optical fiber 201.

Reference numeral 220 is a metal plate that supports the whole optical transceiver including a case. A radiation fin 221 made of aluminum is attached to the back side of the metal plate. The metal plate 220 is made of copper, CuW, etc. as a material with a superior heat dispersion characteristic. On a surface of the metal plate 220, a metal block 2091 (103*a*) which serves as a ground supporting a substrate (terminal block) 2092 (101*a*) of the electrooptical transducer 209 is mounted. As a result, the metal block 2091 and the metal plate 220 conduct heat generated inside the electrooptical transducer 209, and then the radiation fin 221 radiates the heat, with the result that the electrooptical transducer 209 is cooled. Further, on the surface of the metal plate 220, a metal block 2021 (103*a*) which serves as a ground supporting the substrate 2022 (101*a*) of the optoelectronic transducer 202 is mounted. As a result, the metal block 2021 and the metal plate 220 conduct heat generated inside the optoelectronic transducer 202, and then the radiation fin 221 radiates the heat, with the result that the electrooptical transducer 209 is cooled.

In this connection, the optoelectronic transducer 202 includes a photodiode (Pdi) (not illustrated) that receives a light signal inputted from the optical fiber 201 to convert the light signal into a high frequency signal. The optoelectronic transducer 202 further comprises a substrate (terminal block) 2022 (101*a*) having a terminal area 2023 (usually, comprising transmission lines 901*a* through 906*a* having a two-layer grounded planar structure) for outputting the converted high frequency signal. The terminal area 2023 is connected to the flexible substrate 602.

In addition, the electrooptical transducer 209 comprises a substrate (terminal block) 2092 (101*a*) having the terminal area 2093 (usually, comprising transmission lines 901*a* through 906*a* having a two-layer grounded planar structure) for inputting a high frequency signal. The electrooptical transducer 209 further comprises an optical modulator (in which a semiconductor laser (not illustrated) is included) that modulates a laser beam output from the semiconductor laser on the basis of a high frequency signal inputted into the terminal area 2093, and then outputs the modulated laser beam to the optical fiber 210 as a light signal. The terminal area 2093 is connected to the flexible substrate 602. It is to be noted that symbol 903*a* is a dielectric layer.

Additionally, on the printed circuit board side, a first terminal area (not illustrated) connected to the flexible substrate 601 and a second terminal area (not illustrated) connected to the flexible substrate 602 are provided. The first terminal area (101*b*) which is joined to the printed-circuit board 205 usually has transmission lines 901*b* through 906*b* having a two-layer grounded planar structure, which lead to the demultiplexer 204 mounted on the back. It is to be noted that the transmission lines 904*b* through 906*b* correspond to the back side of the printed-circuit board 205 and the transmission line 901*b* corresponds to the front side of the printed-circuit board 205. In a similar manner, the second terminal area (101*b*) which is joined to the printed-circuit board 205 usually has transmission lines 901*b* through 906*b* having a two-layer grounded planar structure, which lead to the demultiplexer 207 mounted on the back. It is to be noted that the transmission lines 904*b* through 906*b* correspond to the back side of the printed-circuit board 205 (101*b*) and the transmission line 901*b* corresponds to the front side of the printed-circuit board 205 (101*b*). It is to be noted that symbol 903*b* is a dielectric layer.

In this connection, the demultiplexer 204 converts a high-speed electric signal of about 40 Gbit/s into a low-speed signal of about 2.5 Gbit/s, whereas the multiplexer 207 converts a low-speed signal into a high-speed electric signal. Accordingly, heat is generated, and it is necessary to dissipate the heat. For this reason, the demultiplexer 204 and the multiplexer 207 are mounted on the back side of the printed-circuit board 205 (101*b*) so that as is the case with the optoelectronic transducer 202 and the electrooptical transducer 209, the heat generated in the demultiplexer 204 and the multiplexer 207 is transferred through the metal plate 220 and then radiates from the radiation fin 221. The demultiplexer 204 and the multiplexer 207 are secured to the metal plate 220 by use of an adhesive superior in heat transfer, a paste material with which metal powder superior in heat transfer is mixed, etc.

The optical transceiver described above is constituted of these parts, which are housed in one case.

Figure 3:
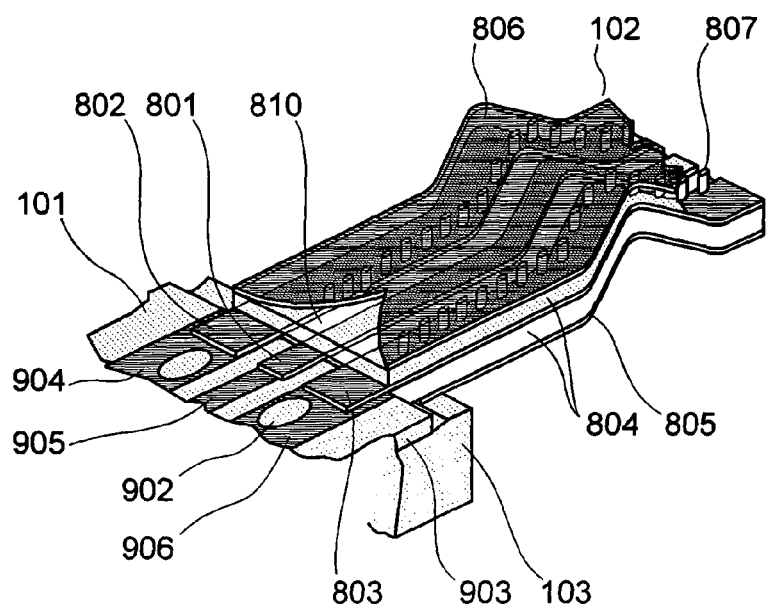
FIG. 3 is a perspective view illustrating a method for connecting to a terminal area of one substrate by use of a flexible substrate having a three-layer structure according to the present invention.

Next, an embodiment of the flexible substrate 601 or 602 used to connect the substrate 2022 (101*a*) or 2092 (101*a*) to the substrate 205 (101*b*), which most typically characterizes the present invention, will be specifically described. FIGS. 2A and 2B are diagrams illustrating the most appropriate embodiment of the flexible substrate 601 or 602. FIG. 2A is a perspective view of the flexible substrate 601 or 602; and FIG. 2B is a diagram illustrating a change in electromagnetic field in the longitudinal direction. FIG. 3 is a perspective view illustrating a structure of a connection section between the substrate 101 and the flexible substrate 102 (601, 602).

As described above, the heat is radiated from the metal plate 220 and the radiation fin 221. Therefore, as for the terminal area 2023 (and 2093) of the substrate 2022 (101*a*) (and 2092 (101*a*)), the electronic part is mounted on the front side of the substrate. As a result, the transmission lines 905*a* through 906*a* are on the upper side. As opposed to this, as for the terminal area of the printed-circuit board 205 (101*b*), the electronic part is mounted on the back side of the substrate. As a result, the transmission lines 905*b* through 906*b* are on the lower side. Moreover, as for the printed-circuit board 205 (101*b*), the electronic parts are mounted on the back side. Accordingly, there is a difference in height between the substrate 2022 (101*a*) (and 2092 (101*a*)) and the printed-circuit board 205 (101*b*).

Figure 4A:
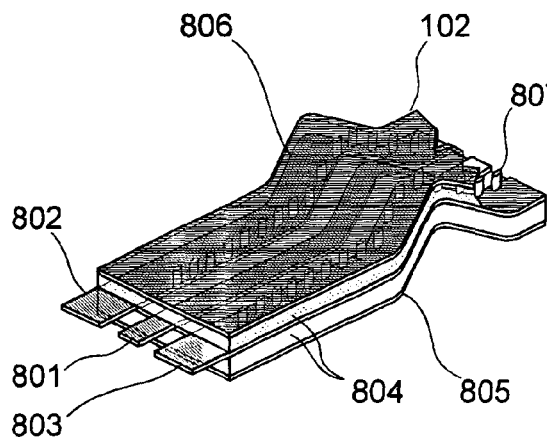
FIGS. 4A and 4B are diagrams illustrating a flexible substrate having a three-layer structure according to the present invention, more specifically.
Figure 4B:
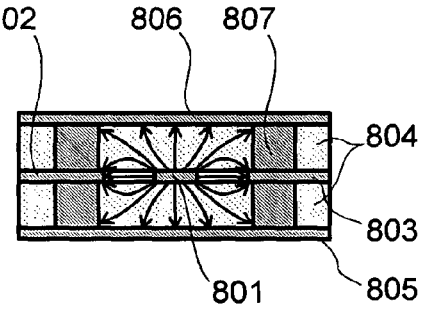

For these reasons, it is so devised that a connection between the substrate 101*a* and the printed-circuit board 101*b* is made by the flexible substrate 102 having a structure in which at least two dielectric layers are sandwiched by at least three conductor layers. In the flexible substrate 102, polyimide, liquid crystal polymer, etc. can be considered as the dielectric layer 804. If a material, the dielectric dissipation factor of which is low, is used as a material of a dielectric, a transmission line having a better transmission characteristic can be realized. The conductor layer on the top surface and the conductor layer on the under surface are made of ground conductors (ground planes) 806, 805. In addition, there is a long and narrow (belt-shaped) signal conductor 801 in the middle conductor layer. Long and narrow (belt-shaped) ground conductors 802, 803 are placed on both sides of the signal conductor 801 while keeping a distance from the signal conductor 801. The ground conductor (ground plane) 806 on the top surface, the ground conductor (ground plane) 805 on the under surface, and the ground conductors 802, 803 on both sides of the signal conductor 801 are electrically connected to one another by through holes or via holes 807, etc. It is to be noted that an interval between the through holes or the via holes 807 is set at a value of $\lambda/10$ or less where $\lambda$ is a wavelength of a signal to be used (it is proportional to a frequency). Accordingly, it is desirable that the ground conductor 806 on the top surface, and the ground conductor 805 on the under surface, and the ground conductors 802, 803 on both sides of the signal conductor 801 be electrically connected to one another by use of conductors at intervals of $\lambda/10$ or less. In other words, the conductor can also be manufactured by laminating a plurality of layers. Thus, as shown in FIG. 4B, the flexible substrate 102 is formed in such a manner that the ground conductors 802, 803, 805, 806, and 807 substantially surround the signal cable 801. Therefore, an electromagnetic field is confined within the signal cable 801 and its surrounding ground conductors 802, 803, 805, 806, and 807, and consequently the electromagnetic field does not leak outside. This also avoids a change in transmission characteristic caused by the influence of the surrounding conductors. However, if it is difficult to place the through holes or the via holes 807 at intervals of $\lambda/10$ or less, an effect of almost completely avoiding the change in transmission characteristic can be produced even if the interval is $\lambda/3$ or less.

Figure 5:
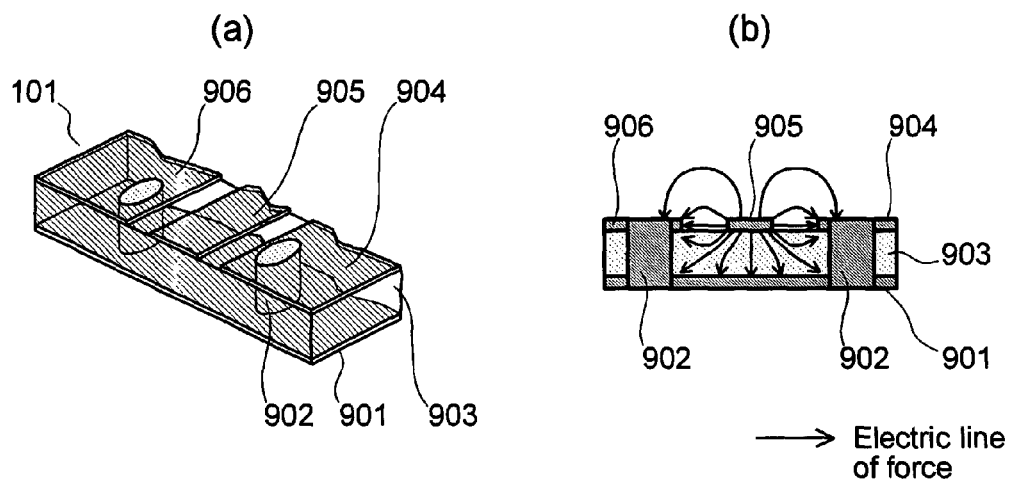
FIGS. 5A and 5B are diagrams illustrating a terminal area having a two-layer structure in a substrate according to the present invention, more specifically.

On the other hand, if the flexible substrate 102 having three layers or more is used as described above, it is necessary to devise a section for connecting to the other substrate 101 (101a, 101b). As shown in FIG. 5, each terminal area of the other substrate 101 is usually a line having a grounded coplanar structure. The ground conductors 904, 906 are placed on both sides of the signal conductor 905. Moreover, because the back side is the ground conductor (ground plane) 901, electrically connecting to the ground conductors 904, 906 through the through holes or the via holes 902 makes it possible to stabilize the ground potential. Consequently, as shown in FIG. 5B, as the electric lines of force, it is possible to prevent the electromagnetic field from extending downward. However, the electromagnetic field propagates while extending upward (to the side where the electronic part are mounted).

Accordingly, to begin with, the flexible substrate 102 is connected to each terminal area of the substrates 101a, 101b. To be more specific, the signal cable 801 of the flexible substrate 102 is connected to the signal conductors 905a, 905b of the substrates 101a, 101b; and the ground conductors 802, 803 on its both sides are connected to the ground conductors 904a, 904b and 906a, 906b on its both sides respectively by joining with solder or a metal bump.

However, at one edge of the flexible substrate 102, a height of the ground conductor (ground plane) 901a forming the terminal area of the substrate 101a differs from that of the ground conductor (ground plane) 805 of the flexible substrate 102. For this reason, both of them are joined with solder, etc. to the metal block 103a having a step in response to the difference in height to establish the electrical connection between them. As shown in FIG. 1, this metal block 103a is placed between the substrate 101a and the metal plate 220, and thereby also plays the role of supporting the whole substrate 101a.

Further, also at the other edge of the flexible substrate 102, a height of the ground conductor 901b forming the terminal area of the substrate 101b differs from that of the ground conductor 806 of the flexible substrate 102. For this reason, both of them are joined with solder, etc. to the metal block 103a having a step in response to the difference in height to establish the electrical connection between them. The metal block 103b only serves as electrical connection between the ground conductors.

Moreover, as shown in FIGS. 2 and 3, in each of the ground conductors 806 and 805 on the flexible substrate 102, V-shaped or approximately V-shaped (microscopically, it is not necessary to make both sides linear) slits 810a, 810b are formed at connection sections 820a, 820b that are connected to the terminal area of the substrate 101a and the terminal area of the substrate 101b respectively. In this manner, each of the slits 810a, 810b has a structure whereby the field intensity observed in an area from the signal cable 801 to each of the ground planes 806, 805 is gradually decreased. Moreover, because each of the slits 810a, 810b is V-shaped or approximately V-shaped, as shown in FIG. 6B through 6D, the slits 810a, 810b also have a structure in which a distance between the signal cable 801 and the electrode 8061a on the edge of the ground plane 806 and a distance between the signal cable 801 and an electrode (not illustrated) on the edge of the ground plane 805 are gradually changed.

As described above, because each of the slits 810a, 810b is so devised to become V-shaped or approximately V-shaped, the electromagnetic field gradually changes as shown in a longitudinal sectional view of FIG. 2B and cross-sectional views of FIGS. 6A through 6D, which reduces the reflection, and the radiation, of the electromagnetic field caused by discontinuity in each of the connection sections 820a and 820b, making it possible to avoid a rapid change in transmission characteristic. To be more specific, for example, when a signal is propagating from the left substrate 101a (2022), a direction of an electric field which is downward gradually changes in the slit 810a of the flexible substrate 102. At the center of the flexible substrate 102 as a cable, the direction becomes symmetrical top and bottom. On the other hand, the direction of the electromagnetic field which is symmetrical top and bottom is changed to downward at the connection section by the slit 810b on the right side before the electromagnetic field propagates to the substrate 101b (205).

Figure 6:
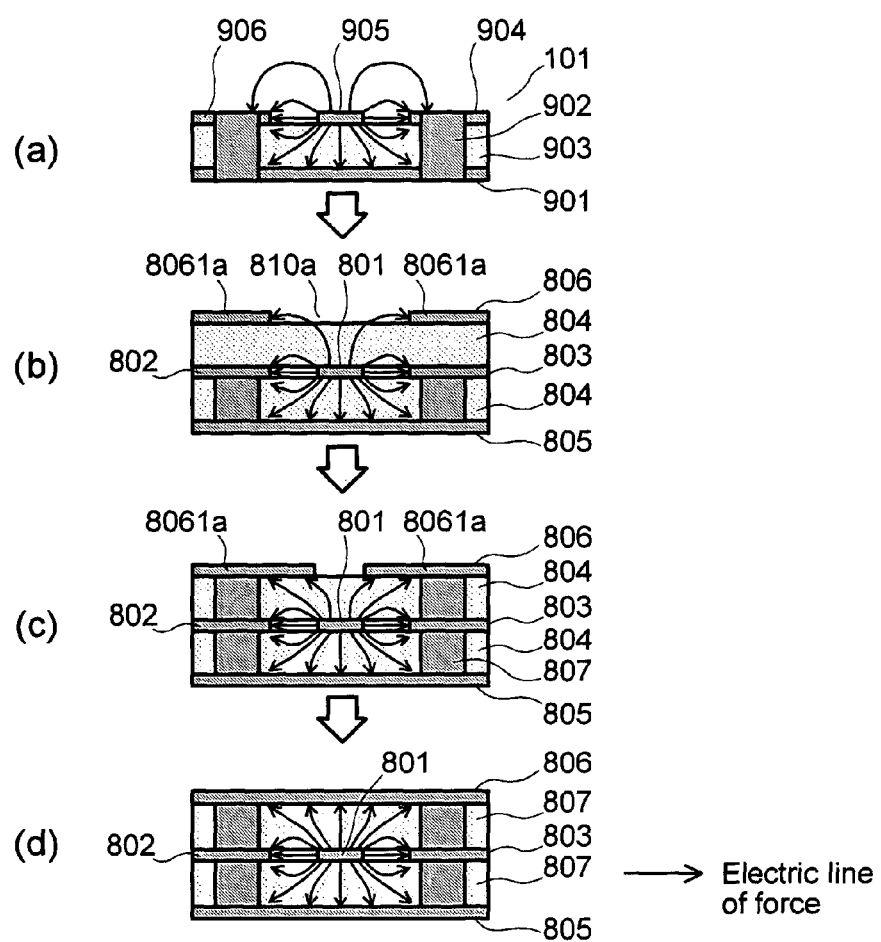
FIG. 6 is a cross-sectional view illustrating a state in which the electromagnetic field distribution is changed by a slit formed in a ground plane on an edge of a flexible substrate having a three-layer structure according to the present invention.

In the connection section 820a, judging from a state as shown in FIG. 6A, it is found out that a width of the slit 810a becomes narrower with further entering the slit 810a as shown in FIG. 6B through 6D (at an edge electrode 8061, a distance to the-signal cable 801 changes), and thereby the electromagnetic field to the ground conductor 806 is confined, causing the electromagnetic field to gradually increase. Also in the connection section 820b, it is found out that in a similar manner, a width of the slit 810b becomes narrower with further entering the slit 810b, causing the-electromagnetic field to the ground conductor 805 to gradually increase. In this manner, providing a structure having electromagnetic-field changing sections at both edges of the flexible substrate 102 makes it possible to realize a structure whereby a disturbance of the electromagnetic field is reduced and the transmission characteristic is improved.

It is to be noted that the embodiment in which the slits are formed in the ground plane can also be applied to a connection between a transmission line having a one-layer coplanar structure formed on the terminal area of the substrate and a flexible substrate formed in a transmission line having a two-layer grounded coplanar structure so that it may mention later.

Next, an embodiment relating to a connection between the ground plane 805 on the flexible substrate 102 (601, 602) and the ground plane 901*a* on the terminal area of the substrate 101*a* (2022, 2092), and relating to a connection between the ground plane 806 on the flexible substrate 102 (601, 602) and the ground plane 901*b* on the terminal area of the substrate 101*b* (205), will be specifically described.

Figure 7:
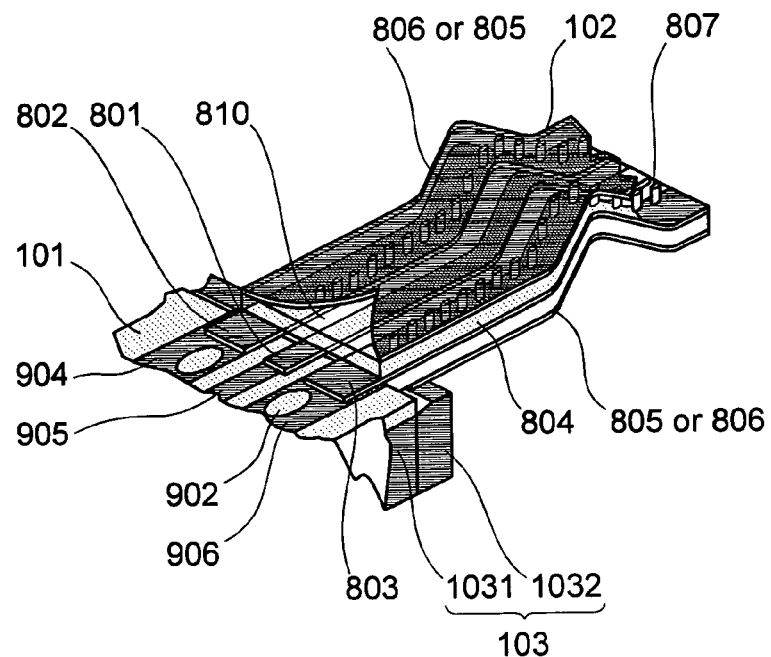
FIG. 7 is a perspective view illustrating a case where a metal block which electrically connects between both ground planes is divided, said case relating to a method for connecting to a terminal area of one substrate by use of a flexible substrate having a three-layer structure according to the present invention.

FIG. 3 illustrates the embodiment in which the one-unit structure is applied to the metal block 103 that provides an electrical connection between each of the ground planes 805, 806 on the flexible substrate 102 and the ground plane 901 on the substrate 101. However, as shown in FIG. 7, the metal block 1031 under the substrate 101 may also be different from the metal block 1032 under the flexible substrate 102. However, it is necessary to provide a structure in which walls between two metal blocks 1031 and 1032 are electrically connected to each other so as to remove clearance between them. If the clearance is left between them, the transmission characteristic becomes worse.

Figure 8:
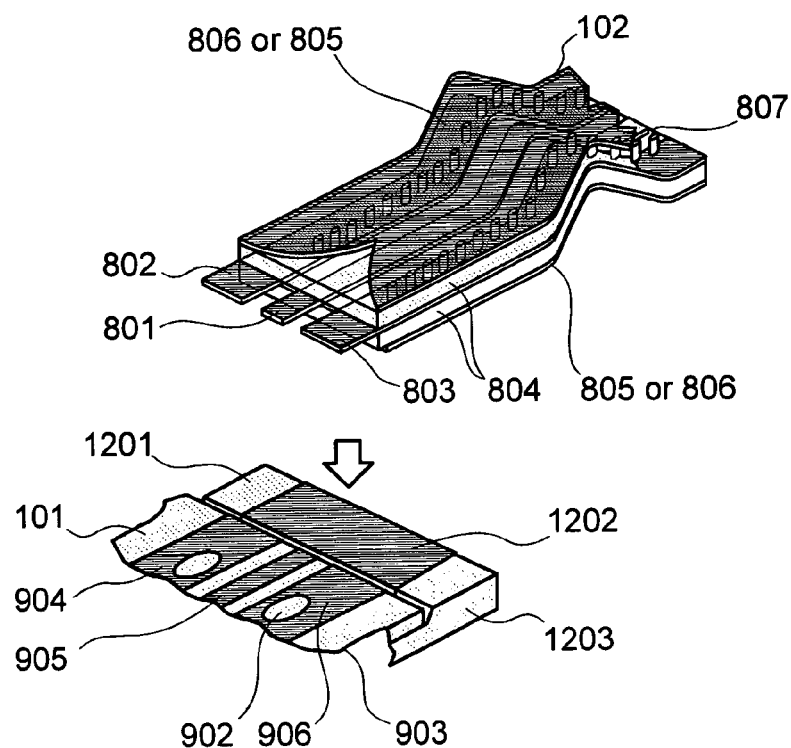
FIG. 8 is a perspective view illustrating a case where a substrate is used to electrically connect between both ground planes, said case relating to a method for connecting to a terminal area of one substrate by use of a flexible substrate having a three-layer structure according to the present invention.

In addition, although the embodiment using the metal block 103 is illustrated in FIGS. 3 and 7, a substrate 1201 comprising another dielectric 1203 having a conductor side 1202 as a substitute for the metal block 103 may also be used as shown in FIG. 8. To be more specific, it is desirable to use a structure in which the ground plane 901 of the substrate 101 is electrically connected to the ground plane 805 or 806 of the flexible substrate 102. By the way, because a thickness of the substrate 101 (101*a*, 101*b*) usually differs from that of one side of the flexible substrate 102, it is necessary to make a step on the substrate 1201 between the conductor side which is connected to the ground plane 901 and the conductor side which is connected to the ground plane 805. As a matter of course, if there is no step, the substrate 1201 becomes flat.

Figure 9A:
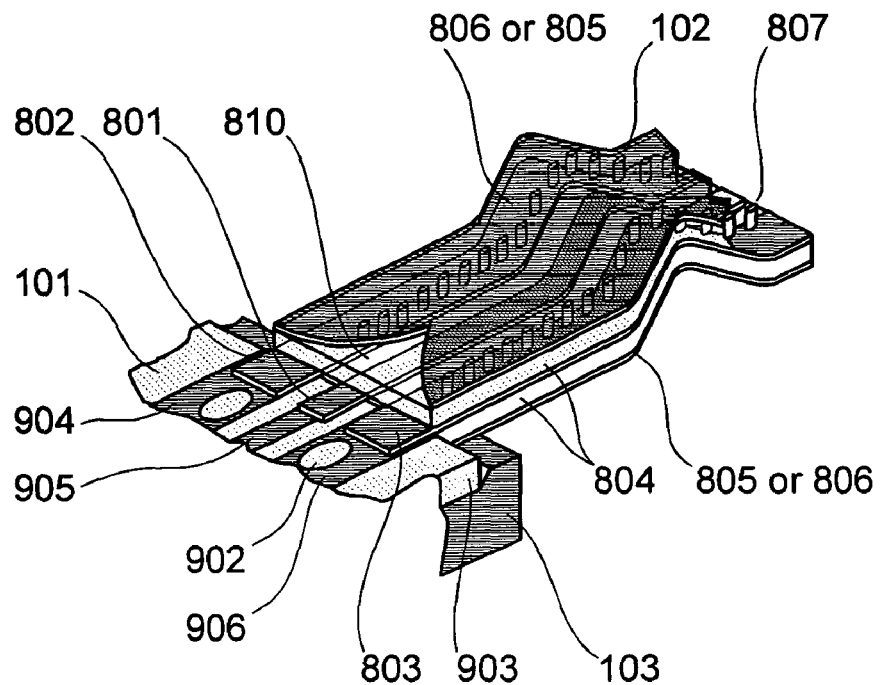
FIGS. 9A and 9B are diagrams illustrating a case where if a metal block is used to electrically connect between both ground planes, an inclined plane is provided in the metal block to improve the transmission characteristic, said case relating to a method for connecting to a terminal area of one substrate by use of a flexible substrate having a three-layer structure according to the present invention, more specifically.

FIG. 9 illustrates an embodiment taking a case where a thickness of the substrate 101 differs from that of the flexible substrate 102. Because there is a difference in thickness between substrates, direct connection just as it is makes a difference in level between the ground plane 901 of the substrate 101 and the ground plane 805 or 806 of the flexible substrate 102, causing a large disturbance in an electromagnetic field in a connection surface, which deteriorates the transmission characteristic.

Figure 9B:
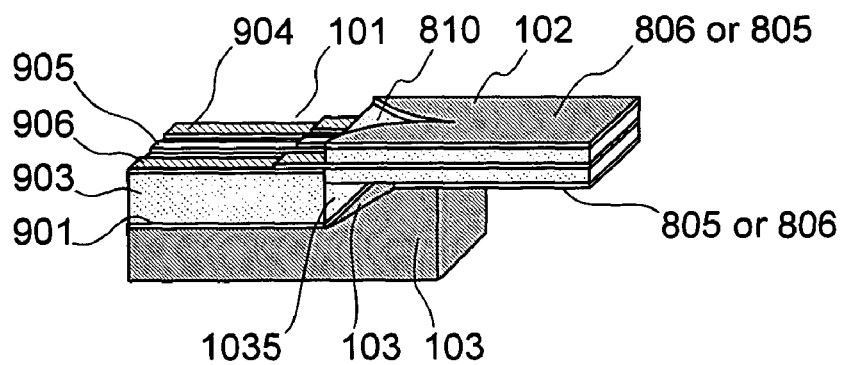

For this reason, as shown in FIG. 9B, providing a slit (inclined part) 1035 opening toward the metal block 103 or toward a boundary part of the step on the substrate 1201, and then eliminating the ground conductor 805 or 806 on the flexible substrate 102 corresponding to this slit 1035, cause an electromagnetic field to gradually change, which makes it possible to reduce the disturbance in electromagnetic field. To be more specific, continuously connecting between the ground plane 901 of the substrate 101 and the ground plane 805 or 806 of the flexible substrate 102 by use of an electric conductor without a rapid change in response to the step causes an electromagnetic field to gradually change, which makes it possible to reduce the disturbance in electromagnetic field.

Figure 10:
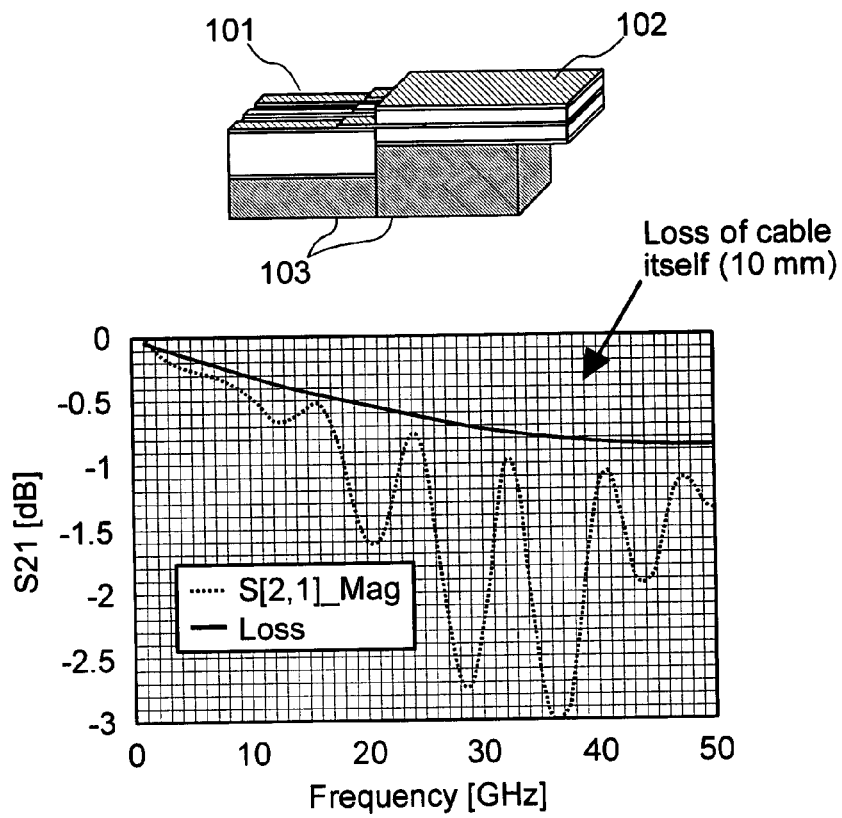
FIG. 10 is a diagram illustrating the relationship between a frequency [GHz] and a transmission characteristic (S21 [dB]) obtained when a flexible substrate having a three-layer structure according to the present invention is merely connected to a terminal area of a substrate, in comparison with the flexible substrate itself (cable itself)
Figure 11:
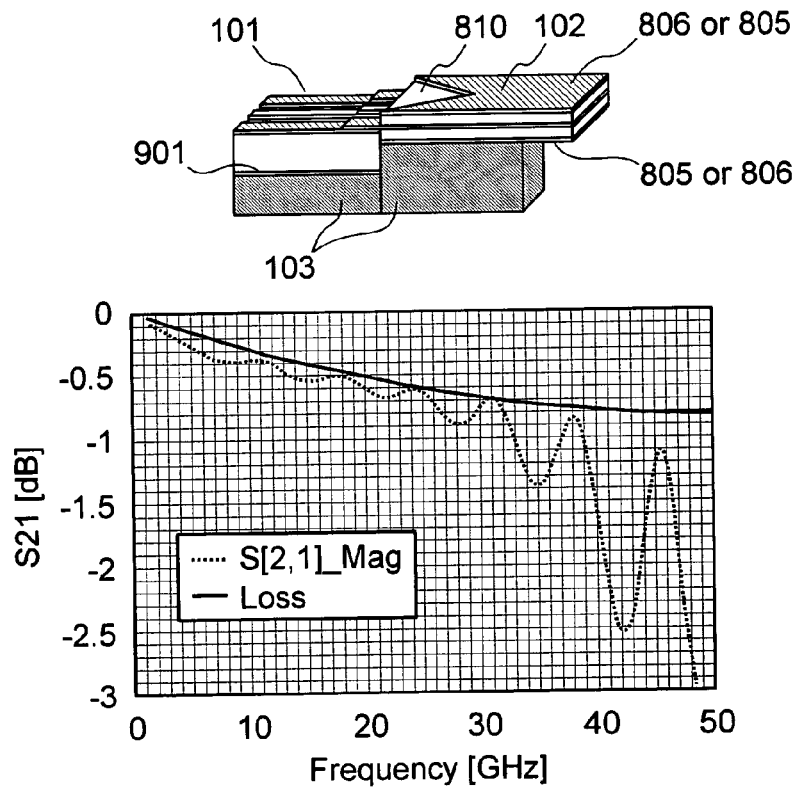
FIG. 11 is a diagram illustrating the relationship between a frequency [GHz] and a transmission characteristic (S21 [dB]) obtained when a flexible substrate, according to the present invention, having a three-layer structure in which a slit having a length of 1 mm is formed is connected to a terminal area of a substrate.

Next, effects produced by the embodiments according to the present invention will be described with reference to FIGS. 10 through 12. The results shown in FIGS. 10 through 12 are determined by the electromagnetic field analysis. FIG. 10 illustrates the result of calculation obtained when the three-layer flexible substrate 102 (601, 602) is directly connected to a terminal area of the substrate 101 having a grounded coplanar line. It is understood that as compared with the loss of a cable itself, a loss at the connection section is large and a transmission loss at a specific frequency is large.

On the other hand, FIG. 11 illustrates the result of calculation obtained when a slit 810 having a depth of 1 mm, which is indicated by a V-shaped depth, is made in the ground plane 806 or 805 on the top surface or the under surface of the flexible substrate 102 (601, 602). It is understood that the transmission characteristic is improved.

Moreover, FIG. 12 illustrates the result of calculation obtained when a slit (inclined part) 1035 opening toward a boundary part of the step of the metal block 103 on the downside or on the upper side is provided. This enables us to understand that the transmission characteristic can be improved to a large extent.

According to the above-mentioned embodiments of the present invention, relating to a flexible substrate used for high-frequency signal transmission, and relating to an electronic part or an electronic system using the flexible substrate, the flexible substrate which connects between terminal areas of two substrates (for example, transmission lines having a grounded planar structure) is devised to have a three-layer structure so that ground conductors substantially surround a signal cable. As a result, an electromagnetic field is confined within the signal cable and the surrounding ground conductors, which prevents the electromagnetic field from leaking outside, and thereby avoids a change in transmission characteristic caused by the influence of surrounding conductors, etc.

In addition, according to the embodiments of the present invention, in the flexible substrate, providing a slit in a ground conductor of a connection section connected to a substrate, etc. makes it possible to reduce a disturbance in electromagnetic field in the connection section, and thereby to improve the transmission characteristic.

Moreover, according to the embodiments of the present invention, even if the flexible substrate is used to connect between two substrates, each of which comprises a terminal area of a transmission line having the grounded coplanar structure which is turned upside down, devising a slit enables an easy change of a mode of an electromagnetic field, which makes it possible to reduce a disturbance in electromagnetic field in the connection section, and thereby to improve the transmission characteristic.

Further, according to the embodiments of the present invention, a transmission line having an improved transmission characteristic can be provided.

Next, another embodiment according to the present invention will be described.

In the above-mentioned embodiment, the substrates 2022 (101*a*), 2092 (101*a*) and the printed-circuit board 205 (101*b*) are secured in such a direction that the substrates 2022 (101*a*), 2092 (101*a*) face a surface of the printed-circuit board 205 (101*b*), on which a signal conductor is formed. Thus, a disturbance in electromagnetic field occurring in the connection section 820 is decreased by using the flexible substrate that employs the structure having three conductor layers, in which the ground layer 806 and the ground layer 805 sandwich, through the dielectric 804, both sides of the surface on which the coplanar structure (structure in which the signal conductor 905a is sandwiched by two ground conductors (ground conductor 904a and ground conductor 906a) of the same layer) is formed, and that further employs the structure having the slit 810 in the connection section 820 of the ground layers 805, 806 which are not connected in response to a distance from a ground layer of the circuit board. However, a structure mentioned below also permits an electromagnetic field in proximity to the connection section to change smoothly.

More specifically, as shown in FIG. 13A, the substrates 2022 (101a), 2092 (101a) and the printed-circuit board 205 (101b) are secured in such a manner that the substrates 2022 (101a), 2092 (101a) and a surface of the printed-circuit board 205 (101b), on which a signal conductor is formed, face in the same direction. In this state, by use of the flexible substrate 102' having a structure that branches toward the connection section (edge) connected to the substrate only by providing the ground layer 806 of the upper layer without providing the ground layer 805 of the lower layer and then by providing the ground layer 806 with the slits 810a, 810b in response to a length of the connection section by which coplanar waveguides are joined, a gap (corresponding to the slits 810a, 810b) made by the branch is placed so that the gap is superposed on the signal conductor 801. The placement is made in such a manner that widths of entrances of the slits 810a, 810b become wider than a width of the signal conductor 801, and that the entrances of the slits 810a, 810b are closed. The slits 810a, 810b are formed in such a manner that depths of the slits 810a, 810b become deeper than a width of the signal conductor 801 in response to a length of the connection section by which coplanar waveguides are joined.

It is to be noted that although, as shown in FIG. 13B, a central part of the flexible substrate 102' excluding the connection sections connected to the substrate 101a (101b) has a grounded coplanar waveguide structure, a structure, such as a microstrip transmission line, in which long and narrow (belt-shaped) ground conductors 802, 803 do not exist as shown in FIG. 13C (ground conductors 802, 803 having a coplanar structure are separated), may also be used.

In addition, in order to satisfy both flexibility and bonding strength of the flexible substrate 102', this embodiment adopts a structure described below.

Figure 14A:
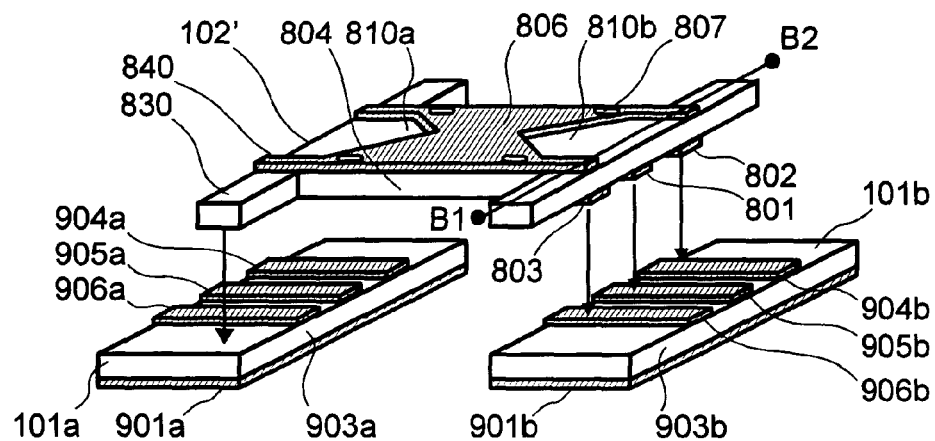
FIGS. 14A through 14C are diagrams illustrating an embodiment modified from the embodiment shown in FIGS. 13A through 13D, more specifically.
Figure 14B:
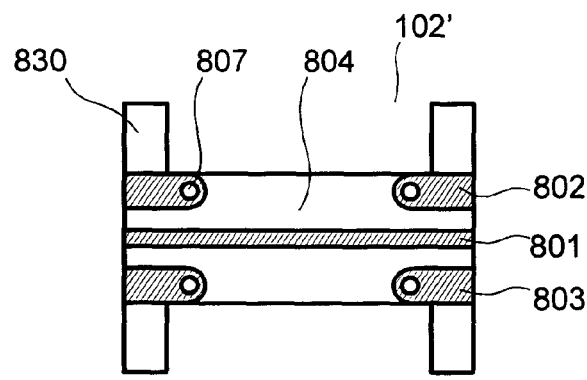
Figure 14C:
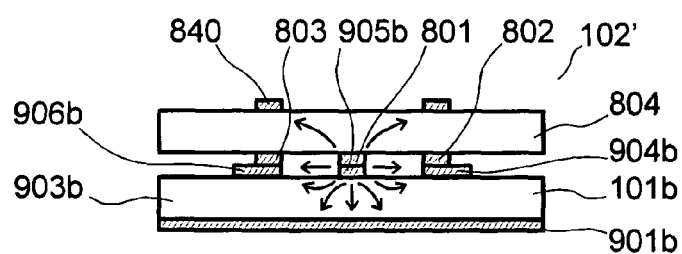
Figure 15A:
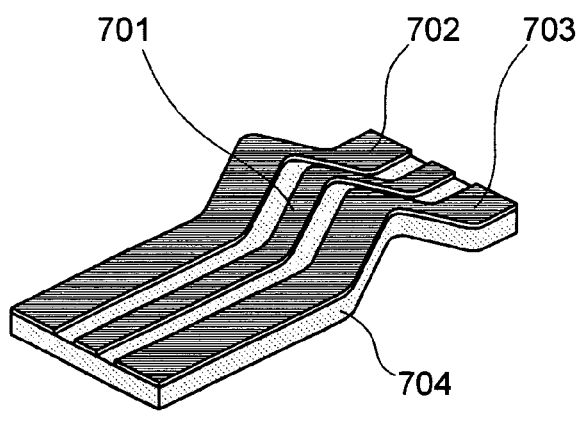
FIGS. 15A and 15B are diagrams illustrating the conventional flexible substrate having a coplanar structure, more specifically.
Figure 15B:
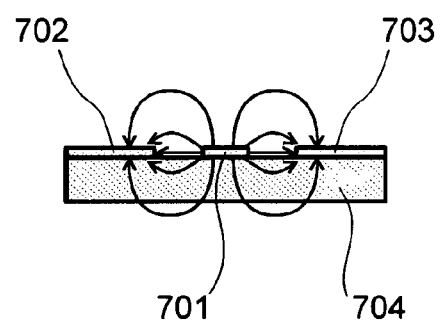

Conventionally, the flexible substrate 102 is joined with solder, metal bumping, or the like, only at terminal areas of the substrate 101a (101b). However, as shown in FIG. 14, it is so devised that the flexible substrate 102' is provided with strengthening projections 830 through which the substrate 101b is joined to the substrate 101a with a resin adhesive.

To be more specific, a coplanar structure of the flexible substrate 102' is joined to a coplanar structure of the circuit board 101a (101b) with solder, or the like. Then, the dielectric layer 804 of the flexible substrate 102' and the insulating layer 903 of the circuit board 101a (101b) are extended to outside of the ground conductors 802, 803 (904, 906) having a coplanar structure, and the parts extending outside are bonded with a resin adhesive to improve bonding strength. In this manner, the flexibility is ensured by narrowing a width of the flexible substrate 102' excluding the connection sections. In this connection, if a conductive paste is used for the joining, the same material can be used for both a junction between the electrode of the circuit board 101a (101b) and the electrode of the flexible substrate 102' and a junction outside it between the dielectric 804 and the insulating layer 903, except an area between the signal electrode and the ground electrode. This provides an advantage of manufacturing in the same process.

Next, still another embodiment according to the present invention will be described.

Even if the structure in FIG. 13 is used, there is a possibility that an electromagnetic field proximity to the connection section may steeply change, resulting in insufficient impedance matching. FIG. 14 illustrates a structure suitable for such a case.

Although a basic layer structure shown in FIG. 14 is the same as the structure in FIG. 13, a point of major difference between them is that the ground conductor 840 used for impedance matching, which is branched by providing slits 810a, 810b in both ends of the ground conductor 806 of the upper layer, is extended to an area where the ground conductor 840 is superposed on the circuit board 101a (101b). If the ground conductor 840 of the upper layer ends before its planar connection is made, an electromagnetic field tends to change steeply. Therefore, a structure to be used is one in which the ground conductor 806 of the upper layer extends to an area where it is superposed on the circuit board 101a (101b), to be exact, over the junction (connection section). This structure makes it possible to reduce the disturbance in electromagnetic field at the junction, and thereby to solve the impedance mismatch.

Here, this structure provides a wide space between the signal conductor 801 and the ground conductor 802 (803), and also between the signal conductor 801 and the ground conductor 803, in the connection section connected to each of the terminal areas 904a through 906a (904b through 906b) of the circuit board 101a (101b). Accordingly, the risk of continuity between the signal conductor 801 and the ground conductors 802 and between the signal conductor 801 and the ground conductors 803, caused by the protruded junction materials, can also be reduced.

What is claimed is:

1. An optical transmission module comprising a substrate having an electronic part mounted on the substrate and a terminal area for inputting/outputting an electric signal into/from the electronic part, wherein:

an electrical connection to a terminal area of the substrate is made by use of a flexible substrate having a structure constituted of at least two layers, said flexible substrate comprising a signal conductor; ground conductors that are placed on both sides of the signal conductor while keeping a distance from the signal conductor; a ground plane provided on an upper layer or a lower layer of the signal conductor across a dielectric; and a conductor that electrically connects between the ground conductor and the ground plane;

a connection section of the flexible substrate has a structure whereby the electric field density observed in an area from the signal conductor to the upper-layer ground plane or the low-layer ground plane is gradually decreased from inside toward an edge of the flexible substrate in a longitudinal direction; and an electric signal is transmitted between the electronic part mounted on the substrate and the flexible substrate.

2. The optical transmission module according to claim 1 wherein a slit is formed in an area of the ground plane at the connection section, the slit extends above the signal conductor along the longitudinal direction of the flexible substrate from the edge of the flexible substrate toward the inside thereof, and a width of the slit becomes narrower as extending toward the inside thereof.

3. The optical transmission module according to claim 2 wherein the slit is V-shaped.

4. The optical transmission modules according to claim 2 wherein the slit does not extend along the longitudinal direction of the flexible substrate to another edge of the flexible substrate.

5. The optical assembly according to claim 1 wherein each of the ground conductors is electrically connected to the ground plane by a through hole formed through the dielectric.

6. The optical assembly according to claim 1 wherein a signal conductor layer and a pair of ground conductor layers are formed in the terminal area of the substrate, the signal conductor layer is provided between the pair of ground conductor layers and is connected to the signal conductor of the flexible substrate, and the pair of ground conductor layers are connected to the ground conductors of the flexible substrate, respectively.

7. The optical assembly according to claim 5 wherein the signal conductor and the ground conductors protrude from the edge of the flexible substrate along the longitudinal direction thereof, and the signal conductor layer and the pair of ground conductor layers are connected to protruding portions of the signal conductor and the ground conductors, respectively.

8. An optical transmission module comprising:
a substrate on which an electronic part is mounted, the substrate having a terminal area, and
a flexible substrate having a dielectric layer, a signal conductor and a pair of ground conductors both formed on a first plane of the dielectric layer, and a ground plane formed on a second plane of the dielectric layer opposite to the first plane of the dielectric layer, the flexible substrate having a connection section at an edge thereof where the signal conductor is electrically connected to the terminal area to transmit an electric signal between the electronic part mounted on the substrate and the flexible substrate,
wherein the signal conductor is disposed between the pair of ground conductors on the plane of the dielectric layer,
each of the signal conductor, the pair of ground conductors, the ground plane and is extended in a longitudinal direction of the flexible substrate, from the edge thereof,
a slit is formed in an area of the ground plane opposite to the signal conductor across the dielectric layer, and extends along the longitudinal direction of the flexible substrate from the edge of the flexible substrate toward the inside thereof, and the slit becomes narrower as extending further from the edge of the flexible substrate.

9. The optical transmission module according to claim 8 wherein the slit is V-shaped on the second plane of the dielectric layer.

10. The optical transmission module according to claim 8 wherein the slit ends at the inside of the flexible substrate between the edge and another edge of the flexible substrate.

11. The optical assembly according to claim 8 wherein the pair of ground conductors are electrically connected to the ground plane by through holes formed through the dielectric layer.

12. The optical assembly according to claim 8 wherein another dielectric layer is formed on the first plane of the dielectric layer, another ground plane is formed on a plane of the another dielectric layer at an opposite side of the another dielectric layer to the dielectric layer, and the signal conductor and the pair of ground conductors are interposed between the dielectric layer and the another dielectric layer.

13. The optical assembly according to claim 12 wherein the another ground plane is extended in the longitudinal direction of the flexible substrate to the edge of the flexible substrate, and the another ground plane is opposite to the slit of the ground plane across the dielectric layer and the another dielectric layer.

14. The optical assembly according to claim 12 wherein the pair of ground conductors are electrically connected to the another ground plane by other through holes formed through the another dielectric layer.

* * * * *